United States Patent
Keller et al.

(10) Patent No.: US 11,713,506 B2
(45) Date of Patent: Aug. 1, 2023

(54) EVAPORATOR, DEPOSITION ARRANGEMENT, DEPOSITION APPARATUS AND METHODS OF OPERATION THEREOF

(71) Applicant: Applied Materials, Inc., Santa Clara, CA (US)

(72) Inventors: Stefan Keller, Mainaschaff (DE); Uwe Schüssler, Aschaffenburg (DE); Jose Manuel Dieguez-Campo, Hanau (DE); Stefan Bangert, Steinau (DE); Byung-Sung Kwak, Portland, OR (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/180,800

(22) Filed: Nov. 5, 2018

(65) Prior Publication Data
US 2019/0071772 A1 Mar. 7, 2019

Related U.S. Application Data

(62) Division of application No. 14/650,267, filed as application No. PCT/EP2013/077569 on Dec. 20, 2013, now abandoned.

(30) Foreign Application Priority Data

Dec. 20, 2012 (EP) .................... 12198683

(51) Int. Cl.
*C23C 16/448* (2006.01)
*C23C 14/24* (2006.01)
(Continued)

(52) U.S. Cl.
CPC .......... *C23C 16/4485* (2013.01); *C23C 14/14* (2013.01); *C23C 14/246* (2013.01);
(Continued)

(58) Field of Classification Search
CPC ........ C23C 16/45561; C23C 16/45565; C23C 16/4557; C23C 16/4485; C23C 16/06
See application file for complete search history.

(56) References Cited

U.S. PATENT DOCUMENTS 3,408,224 A * 10/1968 Ashburn ............... C23C 14/246
427/250
6,143,082 A 11/2000 McInerney et al.
(Continued)

FOREIGN PATENT DOCUMENTS

CN 102165091 A 8/2011
CN 202465855 U 10/2012
(Continued)

OTHER PUBLICATIONS

Office Action for Japanese Patent Application No. 2018-136711 dated Jul. 2, 2019.
(Continued)

*Primary Examiner* — Joseph A Miller, Jr.
(74) *Attorney, Agent, or Firm* — Patterson + Sheridan, LLP

(57) ABSTRACT

A depositing arrangement for evaporation of a material is disclosed herein. The depositing arrangement has an alkali metal or alkaline earth metal for deposition of the material on a substrate. The deposition arrangement has a first chamber configured for liquefying the material; a valve being in fluid communication with the first chamber, and being downstream of the first chamber, wherein the valve is configured for control of the flow rate of the liquefied material through the valve. The deposition arrangement has an evaporation zone being in fluid communication with the valve, and being downstream of the valve, wherein the evaporation zone is configured for vaporizing the liquefied material; a heating unit to heat the material to higher temperatures before providing the liquid material in the
(Continued)

evaporation zone; and one or more outlets for directing the vaporized material towards the substrate.

13 Claims, 5 Drawing Sheets

(51) Int. Cl.
- *H01M 4/38* (2006.01)
- *C23C 14/54* (2006.01)
- *C23C 14/14* (2006.01)
- *C23C 16/06* (2006.01)
- *C23C 16/455* (2006.01)
- *C23C 16/52* (2006.01)

(52) U.S. Cl.
CPC ............ *C23C 14/543* (2013.01); *C23C 16/06* (2013.01); *C23C 16/4557* (2013.01); *C23C 16/45519* (2013.01); *C23C 16/45561* (2013.01); *C23C 16/45565* (2013.01); *C23C 16/52* (2013.01); *H01M 4/381* (2013.01)

(56) References Cited

U.S. PATENT DOCUMENTS

| | | | |
|---|---|---|---|
| 6,358,323 B1* | 3/2002 | Schmitt | C23C 16/45565 118/726 |
| 2001/0000866 A1* | 5/2001 | Sneh | H01L 21/02274 118/723 R |
| 2002/0020767 A1 | 2/2002 | Pyo | |
| 2003/0190422 A1 | 10/2003 | Yoo | |
| 2004/0040503 A1 | 3/2004 | Basceri et al. | |
| 2005/0208220 A1 | 9/2005 | Long et al. | |
| 2005/0217584 A1 | 10/2005 | Abiko et al. | |
| 2007/0148348 A1* | 6/2007 | Huh | C23C 14/12 427/255.6 |
| 2010/0233353 A1* | 9/2010 | Martini | C23C 14/543 118/712 |
| 2012/0156363 A1* | 6/2012 | Quinn | C23C 16/18 427/10 |
| 2012/0233353 A1 | 9/2012 | Arseneau et al. | |
| 2013/0276706 A1* | 10/2013 | Lee | C23C 16/4485 118/726 |

FOREIGN PATENT DOCUMENTS

| | | |
|---|---|---|
| JP | H10025563 A | 1/1998 |
| JP | 2001059161 A | 3/2001 |
| JP | 2002012975 A | 1/2002 |
| JP | 2008500454 A | 1/2008 |
| JP | 2008088490 A | 4/2008 |
| JP | 2009030169 A | 2/2009 |
| JP | 2011084773 A | 4/2011 |
| JP | 2011522118 A | 7/2011 |
| JP | 2014508223 A | 4/2014 |
| KR | 20010071015 A | 7/2001 |
| KR | 20010113315 A | 12/2001 |
| KR | 2000033608 | 11/2003 |
| KR | 20060043241 A | 5/2006 |
| KR | 20070015923 A | 2/2007 |
| KR | 20110038343 A | 4/2011 |
| TW | 201213569 A | 4/2012 |
| TW | 201243072 A | 11/2012 |
| WO | 2005/116290 A1 | 12/2005 |
| WO | 2007034790 A1 | 3/2007 |
| WO | 2008111398 A1 | 9/2008 |
| WO | 2012/081738 A1 | 6/2012 |

OTHER PUBLICATIONS

International Search Report and Written Opinion, PCT/EP2013/077569, dated Jan. 29, 2014.
Office Action from Taiwan Patent Application No. 102145895 dated Jun. 13, 2017.
Office Action for Japanese Patent Application No. 2015-548615 dated Sep. 19, 2017.
Office Action for Korean Patent Application No. 10-2015-7019263 dated Aug. 10, 2020.
Office Action for Chinese Patent Application No. 202010082051.9 (017708CN01DIV) dated Aug. 25, 2021.
Trial Decisision for Korean Application No. 10-2105-7019263 dted Jan. 14, 2022.
Office Action for Korean Patent Application No. 10-2021-7004103 (017708KR01DIV) dated Jun. 29, 2022.
Notice of Allowance for Korean Patent Application No. 10-2021-7004103 (017708KR01DIV) dated Nov. 22, 2022.

* cited by examiner

EVAPORATOR, DEPOSITION ARRANGEMENT, DEPOSITION APPARATUS AND METHODS OF OPERATION THEREOF

CROSS-REFERENCE TO RELATED APPLICATIONS

This application is a divisional of U.S. patent application Ser. No. 14/650,267, filed Sep. 19, 2012, which is the national phase patent application of PCT Application PCT/EP2013/077569, filed on Dec. 20, 2013, and claims the benefit of European Patent Application 12198683.0, filed on Dec. 20, 2012, all of which are incorporated herein by reference in their entireties.

TECHNICAL FIELD OF THE INVENTION

Embodiments of the present invention relate to deposition and evaporation of alkali metals or alkaline earth metals, such as lithium. Embodiments of the present invention particularly relate to evaporation arrangements, deposition apparatuses, and methods of operation thereof for control of vaporized material. Specifically, they relate to a depositing arrangement for evaporation of a material comprising an alkali metal or alkaline earth metal and for deposition of the material on a substrate, a deposition apparatus for evaporation of a material comprising an alkali metal or alkaline earth metal and for deposition of the material on a substrate, and a method of evaporating a material comprising an alkali metal or alkaline earth metal, particularly metallic lithium.

BACKGROUND OF THE INVENTION

Modem thin film lithium batteries are, as a rule, produced in a vacuum chamber, wherein a substrate is provided with several layers, including a lithium layer. The lithium layer is formed, for example, through the deposition of lithium in a vapor state on the substrate. Since lithium is highly reactive, a plurality of measures needs to be addressed to operate and maintain such deposition systems. For example, exposure to air ambient oxidizing vapors, in particular $H_2O$, and contact with personnel after opening the vacuum chamber should be minimized.

Further, vaporization with high deposition rates and increased uniformity is desired. Many types of thin film deposition systems have been deployed in the past. And, for alkali and/or alkaline earth metals, some typical arrangements of thin film deposition systems have been applied. However, these typical arrangements are not so amenable to high volume and low cost manufacturing because the methods have serious challenges in managing the high reactivity of the materials, while scaling to high volume production. This presents serious challenges in producing uniformly deposited pure Li. As is well known, these types of materials, especially Li, can easily be oxidized in reaction with ambient surroundings, e.g., gases, materials, etc. Thereby, lithium is of particular interest since it is suitable for the production of higher energy density batteries and accumulators.

Common deposition systems for lithium, and other alkali metals or alkaline earth metals, respectively, utilize sputtering sources or conventional evaporation sources and methods of operating thereof. Sputtering methods for lithium are challenging, particular with respect to costs and manufacturability, in light of the reactivity of Li. The high reactivity at first influences the manufacturing of the target, which is a necessary component for sputtering, and secondly influences the handling of the resulting targets. Thereby, shipment, installation, preventive maintenance, etc., is more difficult as compared to non-reactive targets as the target material needs to be protected from reaction with ambient air. Another challenge comes from disposing of the spent material on the target as target utilization typically is not 100%. Accordingly, a user needs to neutralize or react the residual materials for safe disposal. Yet further and more importantly, since lithium's melting point is relatively low, at 183° C., the deposition rate can also be limited as the melting point limits against a high power density sputtering regime, a more amenable regime for high volume and lower cost manufacturing.

Conventional evaporation methods for lithium, which could typically utilize point sources, are challenging because of complications to achieve necessary uniformity and manufacturability in scaling it up to high volume manufacturing. Thereby, the need to manage or supply the highly reactive Li metal to the evaporation source and the reactive vapor to the deposition chamber is challenging. However, this is necessary for high volume manufacturing and high uptime manufacturing.

Some prior art alkali and alkaline earth metal deposition systems are known to have insufficient throughput and do not provide for sufficient ease of scalability for high throughput and large substrates. There is a need for alkali and alkaline earth metal deposition sources and systems, particularly lithium deposition sources and deposition arrangements that may be scaled to accommodate the increasing size of substrates and allow for high throughput deposition. Thereby, cost competitive manufacturing of devices such as thin film batteries and electrochromic windows is to be considered. Yet further, uniformity of deposition processes is a desire to be considered.

SUMMARY OF THE INVENTION

In light of the above, a deposition arrangement, a deposition apparatus and a method of evaporating according to the claims and particularly the independent claims are provided. Further aspects, advantages, and features of the present invention are apparent from the dependent claims, the description, and the accompanying drawings.

According to one embodiment, a depositing arrangement for evaporation of a material including an alkali metal or alkaline earth metal and for deposition of the material on a substrate is provided. The arrangement includes a first chamber configured for liquefying the material, a valve being in fluid communication with the first chamber, and being downstream of the first chamber, wherein the valve is configured for control of the flow rate of the liquefied material through the valve, an evaporation zone being in fluid communication with the valve, and being downstream of the valve, wherein the evaporation zone is configured for vaporizing the liquefied material, and one or more outlets for directing the vaporized material towards the substrate.

According to another embodiment, a deposition apparatus for evaporation of a material including an alkali metal or alkaline earth metal and for deposition of the material on a substrate is provided. The apparatus includes a vacuum chamber for depositing the material on the substrate therein, and a deposition arrangement. The arrangement includes a first chamber configured for liquefying the material, a valve being in fluid communication with the first chamber, and being downstream of the first chamber, wherein the valve is configured for control of the flow rate of the liquefied material through the valve, an evaporation zone being in fluid communication with the valve, and being downstream of the valve, wherein the evaporation zone is configured for vaporizing the liquefied material, and one or more outlets for directing the vaporized material towards the substrate.

According to a further embodiment, a method of evaporating a material comprising an alkali metal or alkaline earth metal, particularly metallic lithium, is provided. The method includes liquefying the material in a first chamber, guiding the liquefied material from the first chamber through a control valve to a evaporation zone, evaporating the material in the evaporation zone, and directing the vapor of the material on a substrate.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Figure 1:
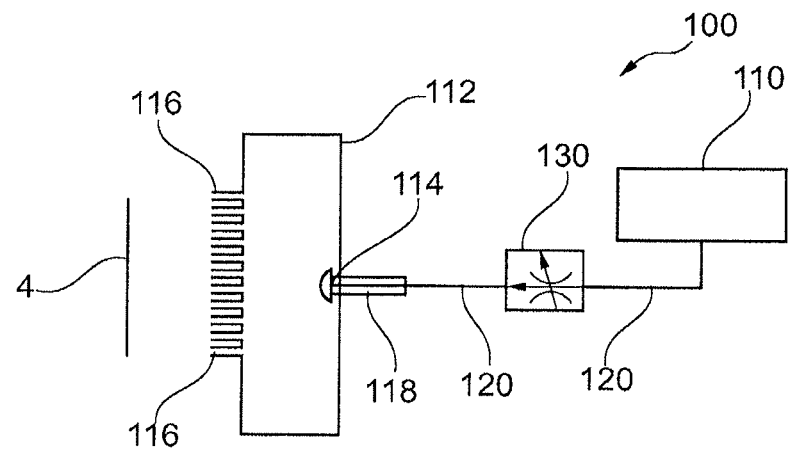
FIG. 1 shows a schematic view of a deposition arrangement for evaporation of alkali metals or alkaline earth metals, such as lithium, according to embodiments described herein and includes a liquefying zone, a control valve for control of a flow rate and an evaporation zone downstream of the valve.

FIG. 1 shows a deposition arrangement 100 for evaporation of alkali and alkaline earth metals, particularly lithium. A first chamber or tank 110 is provided for receiving the material to be deposited. Typically, the tank is provided such that the material to be evaporated in the arrangement, i.e. an alkali and alkaline earth metal, e.g. lithium, can be provided in tank 110 under a non-reactive atmosphere. For example, the non-reactive atmosphere can be argon or another inert gas suitable to prevent reaction of the material to be evaporated, which is typically highly reactive.

The tank 110 is configured to heat the material to a temperature above the melting point, for example 5° C. to 100° C., for example 20° C. to 60° C. (e.g. 20° C. or 40° C.) above the melting point of the material to be deposited. Thereby, the material to be deposited is transported towards the vapor distribution showerhead 112 or a respective nozzle via the valve 130 in a liquid state. Accordingly, according to some embodiments, which can be combined with other embodiments described herein, the conduit or conduits 120 and/or the valve 130 can be configured to be heated such that the liquid alkali or alkaline earth metal can be provided to an evaporation zone, e.g. in or close to the showerhead.

According to typical embodiments, the deposition system for the alkali and alkaline earth metal, e.g. lithium, has one or more outlets for directing the vapor of the alkali and alkaline earth metal towards a substrate for deposition of the alkali and alkaline earth metal on the substrate. The outlet can be one or more openings or one or more nozzles, which can e.g. be provided in a showerhead or another vapor distribution system. According to some embodiments, which can be combined with other embodiments described herein, the evaporator arrangement can include a nozzle for guiding the vapor towards the substrate. As shown in FIG. 1, the arrangement can include a vapor distribution showerhead 112, e.g. a linear vapor distribution showerhead 112 having a plurality of nozzles 116.

For existing lithium evaporators, the precursor reservoir is a single chamber component where the Li metal both melts and evaporates to reach a showerhead in the deposition chamber. Thereby, the evaporated material, i.e. the vapor, is guided through a single separation valve in the vapor state. As shown in FIG. 1, and according to embodiments described herein, the region for the material to be evaporated, e.g. lithium, is separated into two chambers, zones or areas. The first chamber, such as the tank 110, liquefies the alkali or alkaline earth metal, the liquefied alkali or alkaline earth metal is guided through valve 130, and a further area, zone or chamber downstream of the valve 130 evaporates the alkali or alkaline earth metal.

As shown in FIG. 1, the liquid material is guided in the material feed system from the first chamber 110 through conduits 120 and through the valve. Before entering the vapor distribution showerhead 112, the liquid material is guided from the valve 130 through conduit 120 into the showerhead 112. Thereby, a heating unit 118 can be provided adjacent to the showerhead 112 to heat the material to higher temperatures before providing the liquid material in the evaporation zone 114. The material is evaporated in the evaporation zone 114. The material is distributed in the showerhead 112 and directed through nozzles 116 towards the substrate 4.

According to some embodiments, which can be combined with other embodiments described herein, the valve can be a control-valve for controlling or adjusting the flow rate of the liquid material. The valve can separate the liquefying zone and the evaporation zone. The first chamber or tank 110 stores the solid lithium metal. It is used to melt and/or liquefy the solid lithium metal. The melted or liquefied lithium metal flows, i.e. in a liquid state, into a second chamber or another evaporation zone. Even though reference is sometimes made to lithium metal herein, it is understood that also other alkali or alkaline earth metals, which are highly reactive, can benefit from the arrangements described herein. Particularly alkali metals can be used, and the arrangements and apparatuses can be configured for alkali metals. Accordingly, also sodium, potassium, rubidium or cesium, can be evaporated for desired applications. Yet, utilization of and configuration for lithium is a typical embodiment. Lithium is even more reactive as compared to some other alkali or alkaline earth metals and can be used for a plurality of applications.

In light of the above, and according to some embodiments, which can be combined with other embodiments described herein, the tank 110 or a respective chamber for feeding the material to be evaporated into the arrangement, apparatus or system can be replaceable and/or re-fillable. Typically, it can be replaceable and/or re-filled while the material to be evaporated is under a protective atmosphere such as argon, another inert gas, and/or under vacuum conditions.

According to yet further embodiments, which can be combined with other embodiments described herein, the first chamber can be an open chamber or a closed chamber. Typically, the opening of an open chamber can be used to re-fill material to be melted and evaporated in the deposition arrangement. A closed chamber can be provided with a lid configured for opening the chamber. Material to be melted and evaporated can be re-filled when the lid is open. Chambers having a lid allow more easily for a protective atmosphere, as an overpressure such as a pressure of atmospheric pressure plus 50 mbar to a pressure of atmospheric pressure plus 300 mbar can be provided in the material feed system of the deposition arrangement.

As described herein, the material feed system includes the portion of the deposition arrangement in which the liquid materials is fed towards the evaporation zone. Typically, the material feed system can include a first chamber, conduits and a valve. Yet, further it can include one or more purge gas conduits, a supply system for protective gas and/or elements to control the temperature of the material feed system.

According to different embodiments described herein, which can be combined with other embodiments described herein, the further chamber or evaporation zone for evaporation of the material can be the nozzle for directing the vapor towards a substrate, the vapor distribution showerhead 112, an evaporation zone 114, or a respective area, which is provided between the valve 130 and the vapor distribution showerhead 112 or which is provided in the vapor distribution showerhead.

According to typical implementations, which can be combined with other embodiments described herein, the evaporation zone 114 can be a chamber, a crucible, a boat, or a surface, configured to provide the energy for evaporation. Typically, the zone or surface has a sufficient surface contact area, e.g. in the range of 1 cm$^2$ to 50 cm$^2$, for example 1 cm$^2$ to 10 cm$^2$, to provide sufficient energy to evaporate the material. Thereby, the surface area can be provided by a fin-structure where on or more fins protrude from a base, by a cup-like like shape, or by a spoon-like shape.

According to some implementations, a showerhead can be understood herein, includes an enclosure having openings such that the pressure in the showerhead is higher than outside of the showerhead, for example at least one order of magnitude.

By providing a linear vapor distribution showerhead 112 uniformity of the deposition on the substrate 4 can be increased. However, it has to be considered that a plurality of nozzles also results in an increasing demand for a continuous and controlled flow of the material towards the vapor distribution showerhead 112, as well as the need to provide new material in the tank 110 upon usage of the material. Due to the ability to provide new material, e.g. by replacing the tank, a continuous or quasi-continuous operation of the evaporation arrangement, of an apparatus for evaporation having such an evaporation arrangement according to embodiments described herein, or of a system for evaporation having such an evaporation arrangement according to embodiments described herein, can be provided.

As described above, FIG. 1 shows a schematic cross-sectional view of an evaporation arrangement 100, wherein a tank 110 is connected with a conduit 120 to the valve 130, which is further connected with a further conduit 120 with the evaporation showerhead 112. The material, e.g. lithium, is liquefied in the tank 110, is guided in liquid 20 form through the valve 130 and is evaporated after the valve 130 to be guided via the outlet, e.g. nozzles 116, towards substrate 4.

According to some embodiments, the substrate or substrates can be processed vertically, i.e. the linear gas distribution showerhead 112 is arranged vertically within a chamber and a substrate positioner holds the substrate 4 in a vertical processing position, as exemplarily shown in FIG. 1. One advantage of this arrangement is that any particles created during processing will fall towards the bottom of a chamber and not contaminate the substrate 4.

However, providing a material feed system with liquid material in addition to the evaporation zone allows for an arbitrary orientation of the showerhead, such that deposition arrangements according to embodiments described herein, can be more flexibly used as compared to other deposition sources. For example, top down evaporation can be used, e.g. in semiconductor processing, bottom up evaporation can be used, e.g. for flexible substrates, or any other orientation can be used. This flexibility in directionality in deposition comes from having an independent reservoir and deposition zone. Accordingly, an advantage as compared to crucible deposition can optionally be provided.

Although the showerhead shown in FIG. 1 is a linear showerhead, other shapes of showerheads are also within the scope of the invention. What shape the showerhead should have will depend on both, the type of chamber and the shape of the substrate. For example, a point source, i.e. a single nozzle, or a circular showerhead may be selected for a chamber that processes circular substrates, such as when processing semiconductor wafers. Whereas a rectangular showerhead may be selected for processing large rectangular substrates, batch processes may also make those types of showerhead shapes more preferable. For continuous inline processing of large size rectangular or square substrates, a linear showerhead may be selected to better control the distribution of process gases over the substrate as the substrate passes by the showerhead. With respect to point source nozzles it should, however, be considered that challenges may result from managing multiple point sources to achieve uniform deposition on large area substrates. Accordingly, beneficially linear vapor distribution showerheads can be used, particularly for in-line or dynamic processing apparatus. Circular, rectangular or two or more linear vapor distribution showerheads can be used for static deposition processes of substrates of various shape and size.

According to some embodiments, which can be combined with other embodiments described herein, the embodiments described herein can be utilized for evaporation on large area substrates, e.g. for electrochromic windows or lithium battery manufacturing. According to some embodiments, large area substrates or respective carriers, wherein the carriers have one or more substrates, may have a size of at least 0.67 m$^2$. Typically, the size can be about 0.67 m$^2$ (0.73×0.92 m—Gen 4.5) to about 8 m$^2$, more typically about 2 m$^2$ to about 9 m$^2$ or even up to 12 m$^2$. Typically, the substrates or carriers, for which the structures, apparatuses, such as cathode assemblies, and methods according to embodiments described herein are provided, are large area substrates as described herein. For instance, a large area substrate or carrier can be GEN 4.5, which corresponds to about 0.67 m$^2$ substrates (0.73×0.92 m), GEN 5, which corresponds to about 1.4 m$^2$ substrates (1.1 m×1.3 m), GEN 7.5, which corresponds to about 4.29 m$^2$ substrates (1.95 m×2.2 m), GEN 8.5, which corresponds to about 5.7 m$^2$ substrates (2.2 m×2.5 m), or even GEN 10, which corresponds to about 8.7 m$^2$ substrates (2.85 m×3.05 m). Even larger generations such as GEN 11 and GEN 12 and corresponding substrate areas can similarly be implemented.

The herein described arrangements, apparatuses, systems, methods and processes can be utilized for the coating of glass substrates. However, using them, it is also possible to coat wafers, such as silicon wafers, of e.g. 200 mm or 300 mm diameter. For example, a substrate carrier can be equipped with one or with several wafers. The length of the vapor distribution showerhead, e.g. a vaporizer tube, can be adjusted to achieve the uniform coating on a large area substrate, having a substrate height of h, or of all substrates placed in a carrier. Yet further, flexible substrates of synthetic material or metal can also be processed with embodiments described herein. According to typical implementations, a substrate positioner, a substrate support or a substrate transport system can be provided and configured to position and/or move the substrate in and through a procession region.

Embodiments described herein provide an improved alkali metal, e.g. lithium, deposition system and source technology for creating thin and uniform films at high deposition rates and with reduced manufacturing cost. The deposition sources, arrangements, apparatuses, systems and methods can be applied in many fields that require uniform deposition of alkali metals, such as Li. This can be electrochemical devices which use lithium as the charge carrying element. Examples of such electrochemical devices include electrochromic windows and devices and thin film solid state batteries. Embodiments described herein significantly reduce the cost and manufacturability of existing solutions for depositing alkali metals, e.g. Li metal.

Figure 2:
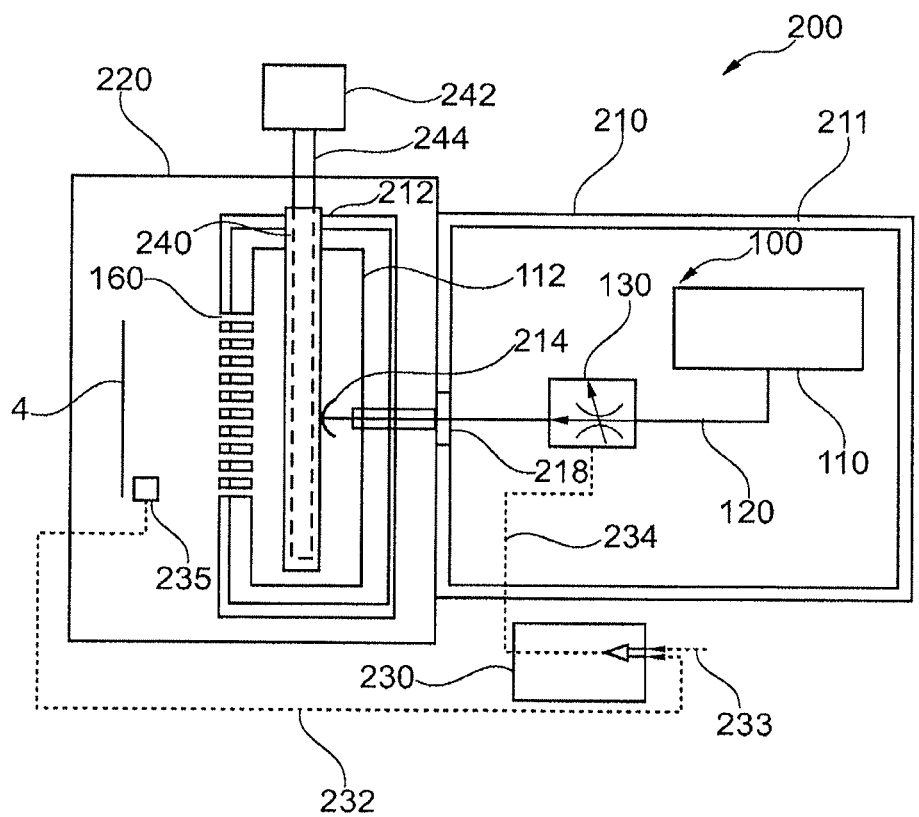
FIG. 2 shows a schematic view of another deposition arrangement and apparatus for evaporation of alkali metals or alkaline earth metals, such as lithium, according to further embodiments described herein and includes a liquefying zone, a control valve for control of a flow rate and an evaporation zone downstream of the valve.

FIG. 2 shows a schematic cross-sectional view of a deposition apparatus 200 with a deposition arrangement 100. Thereby, FIG. 2 illustrates one embodiment and can be used to describe yet further embodiments. The first chamber or tank 110, into which the material to be evaporated, e.g. lithium, is provided in an enclosure 210. For example, the enclosure can be insulated. Thereby, a temperature controlled environment can be provided for the first chamber and the valve as well as the conduits 120. According to typical embodiments, the temperature can be controlled to be from 185° C. to 285° C., e.g. about 230° C. or 200° C. For alkali metals or alkaline earth metals other than lithium, other temperatures could be provided and adjusted according to the melting point, e.g. to 63° C. or above for potassium. According to typical embodiments, which can be combined with other embodiments described herein, the temperature for liquefying the materials can be provided from 5° C. to 100° C., e.g. 50° C. above the melting point of the material to be deposited on the substrate.

Upon heating of the material feed system including the tank 110, the conduits 120, and the valve 130, to or above the melting point of the respective alkali metal, the metal is melted or liquefied and flows through the conduits in a liquid form. According to typical embodiments, one or more of the elements in the enclosure 210 can be individually heated and/or the interior of the enclosure can be heated as a whole. Typically, insulation as indicated by the wall 211 can be provided to reduce loss of heating energy. Additionally or alternatively, individual elements in the enclosure 210 can be insulated separately (not shown).

According to typical embodiments, which can be combined with other embodiments described herein, the material feed system and particularly the valve and the conduits are configured to provide an essentially constant flow rate of the liquid lithium. Accordingly, the diameter of the conduits should be sufficiently small to result in an essentially constant flow rate towards the evaporation zone. Thereby, for example, the conduits can have a diameter of 1 mm$^2$ to 10 mm$^2$. The diameter and desired flow rate can thereby also depend on the size of the showerhead and the respective processing zone, such that deposition arrangement for larger substrate may have larger conduit diameters as compared to deposition arrangements for smaller substrates.

In light of the fact that the amount of material in the comparable thin conduits is limited and that the temperatures in the liquid material feed system and that the evaporation zone can be maintained for interruption of the deposition process, the deposition arrangement can be easily and fast switched on and off. Therefore, no shutter between the evaporation zone and the substrate is required.

According to yet further embodiments, which can be combined with other embodiments described herein, a showerhead, particularly for large area substrates or large area carriers, can be provided with one or more material feed systems. Thereby, a first chamber, conduits, a control valve, and an evaporation zone can be provided for each of the one or more material feed systems. Each material feed system can be provided at a desired position of the vapor distribution showerhead for providing the vapor of the material in the vapor distribution showerhead. For example, two or more material feed systems can be provided to feed the same material into the vapor distribution showerhead in order to increase the deposition rate. Yet similarly, it is also possible to feed more than one kind of material in the vapor distribution showerhead in order to deposit a compound of the different materials provided in the different material feed systems.

As shown in FIG. 2, valve 130 is connected to tank 110 via conduit 120 and with the vapor distribution showerhead by further conduit 120. According to yet further embodiments, described herein, the valve can be positioned adjacent the tank 110, adjacent the showerhead, or adjacent a further chamber for evaporation of the alkali metal, such that the number of conduits can be reduced. However, typically the valve will be located at some distance to an evaporation zone in order to reduce impact of the evaporation temperature on the valve. The conduits 120, as shown in the figures described herein, are exemplary. One or more conduits can be arranged to have the first chamber configured to melt and/or liquefy the material, the valve configured to control the material flow of the liquid material, the evaporation zone and the vapor distribution showerhead to be connected for fluid communication.

As shown in FIG. 2 and according to some embodiments described herein, a vacuum feed-through 218 is provided for the conduit to feed the metal, e.g. the liquid 25 metal, into the vacuum chamber 220. The feed-through 218 can provide for thermal insulation between the lower temperatures in the enclosure 210 and the higher evaporation zone temperatures and/or for vacuum separation between the enclosure 210 and vacuum chamber 220. The vacuum chamber 220 is configured for depositing the metal on the substrate.

As shown in FIG. 2, the vapor distribution showerhead 112 is heated to vaporize the liquid lithium as indicated by evaporation zone 214. The liquid material is guided into the vapor distribution showerhead 112. The vapor distribution showerhead is heated by a heating unit, e.g. an inner heating tube 240. For example, the inner heating tube can be an electric heating element, which is connected by connections 244 to power supply 242. FIG. 2 further shows an insulator 212 of the vapor distribution showerhead 112. The insulation results in the reduction of heating power and/or more uniform heating of the vapor distribution showerhead. According to additional or alternative modifications thereof, the heating of the vapor distribution showerhead 112 can be provided by radiation heating, by heating lamps, e.g. IR heaters, inductive heating, electrical heating (as described above with respect to FIG. 2) and combinations thereof.

The outlets, e.g. nozzles 160, provided at the vapor distribution showerhead guide or direct the vapor of lithium towards the substrate 4. According to typical embodiments, the outlets or nozzles can also be provided as openings in the vapor distribution showerhead. Further, for a linear vapor distribution showerhead, the arrangement of openings or nozzles can be for example one or more lines of openings or nozzles. For rectangular vapor distribution showerheads, the openings or nozzles can be distributed along and within a rectangular shape. For round vapor distribution showerheads, the openings or nozzles can be distributed along and within a circular shape. Typically, the openings or nozzles can be distributed such that the deposition of the vapor on the substrate 4 is uniform. Thereby, the openings or nozzles can be at least partly uniformly distributed along one of the above described shapes. However, in order to compensate for edge effects at the perimeter of the shape, the density of openings or nozzles can be varied in some regions of the vapor distribution showerhead.

According to some embodiments and as shown in FIG. 2 a deposition rate measurement device 235 can be provided in the vacuum chamber 220. Thereby, the deposition rate of the lithium or another alkali metal on the substrate can be monitored. According to typical embodiments, one or more oscillating crystals can be utilized for thickness measurement. Additionally or alternatively, optical measurement methods within the showerhead or at further measurement sections or openings of the showerhead can be utilized to determine the deposition rate. According to yet further additional or alternative options, a pressure measurement inside the showerhead, a thickness measurement of the layer deposited on the substrate, e.g. a conductivity measurement such as an Eddy current measurement of the layer, can be conducted to determine the deposition rate. The signal relating to the deposition rate can be utilized for control of the control valve.

As shown by signal line 232 in FIG. 2, a signal corresponding to the measurement result of the deposition rate measurement device 235 can be fed to a controller 230, which controls the valve 130 depending on the signal received from the deposition rate measurement device 235. For example, a proportional-integral-derivative controller (PID controller) can be used. The PID controller receives the signal via signal line 232 and further receives and/or stores a nominal layer thickness value or another value correlating to a desired deposition rate. Thus, according to some embodiments, which can be combined with other embodiments described herein, a feedback controller is provided for controlling the valve 130. Thereby, a closed loop control of the flow rate of liquid material flowing through the valve can be provided. Accordingly, simplified control of the deposition rate and/or of the deposition uniformity can be provided.

According to typical embodiments, which can be combined with other embodiments described herein, the valve 130 can be a control valve, i.e. a valve to control the flow rate through the valve. For example, the control valve can be configured to control the flow rate with a precision of ±50 g/h or below, such as ±0.1 g/h to 5 g/h.

According to embodiments described herein, the control of deposition rate is simplified and more stable. Due the control of the flow rate of liquid material through the valve, there is no more need to control the deposition by a chamber temperature in the chamber wherein the material is melted and evaporated. Such a chamber temperature control is difficult because although the temperature may be stable, the evaporation rate may be different over the life of the reservoir content. This is because the evaporation rate also depends on the "surface area" of the metallic Li, which is in contact with the heated chamber, which may change over the life of the reservoir as volume ratio (and thus the surface area ratio) of the metallic Li vs. non-metallic Li compounds (reacted or oxidized, higher melting phases of Li) will likely change. Embodiments described herein control the deposition rate with the amount of liquid Li flowing through the valve (e.g., mass flow controllers), which will fully evaporate in the "flash evaporation chamber", i.e. the vapor distribution showerhead or another chamber between the valve and the vapor distribution showerhead. A full evaporation of the Li can be assured as only the metallic Li melts in the first chamber (by keeping temperature above Li melting temperature but below melting temperature of reacted Li compounds) to flow into the second flash evaporation chamber. According to typical embodiments, the temperature in the evaporation chamber or evaporation zone can be 600° C. or above, e.g. 800° C. or above such as 800° C. to 1000° C.

Further, according to embodiments described herein, the valve is configured and/or arranged such that liquid alkali metal, e.g. liquid metallic lithium, flows through the valve. Thereby, the hardware requirements are reduced, specifically for the valve that separates the source, e.g. the tank 110, and the evaporation zone or second chamber, e.g. the vapor distribution showerhead 112. For one chamber evaporators, wherein the material is melted and vaporized in one chamber, a valve must withstand temperatures in the 600° C. to 800° C. range to keep the evaporated Li metal vapors from condensing and clogging up the path. According to embodiments described herein, the valve, conduits, and/or other mass flow controllers only need to withstand temperatures of about 350° C. or even below. Thereby, it should be considered that corrosion of materials due to exposure to lithium will be higher for higher temperatures of liquid or vaporized lithium. Accordingly, providing an extended group of components, which is only in contact with liquid lithium as compared to lithium vapor, reduces corrosion in the overall system.

According to embodiments described herein, a vapor distribution chamber is provided wherein the precursor reservoir design is configured for melting or liquefying the material. The flow of the material or precursor will be controlled by the valve, e.g., a micro-valve. A second chamber or zone is used to evaporate, e.g., flash evaporate, the liquid alkali metal, e.g., lithium, which flows into the second chamber or zone through the valve. The deposition rate can, thus, be controlled by the flow through said valve. According to typical embodiments, which can be combined with other embodiments described herein, the deposition arrangement for evaporation of alkali or alkaline earth metals, typically, metallic lithium, apparatuses including such deposition arrangements, and methods of operating thereof can be utilized for processes where metallic lithium deposition (or other alkali metals) is desired. For example, this can be electrochemical devices, such as electrochromic windows and thin film batteries, Li deposition during OLED device fabrication, etc.

Figure 3:
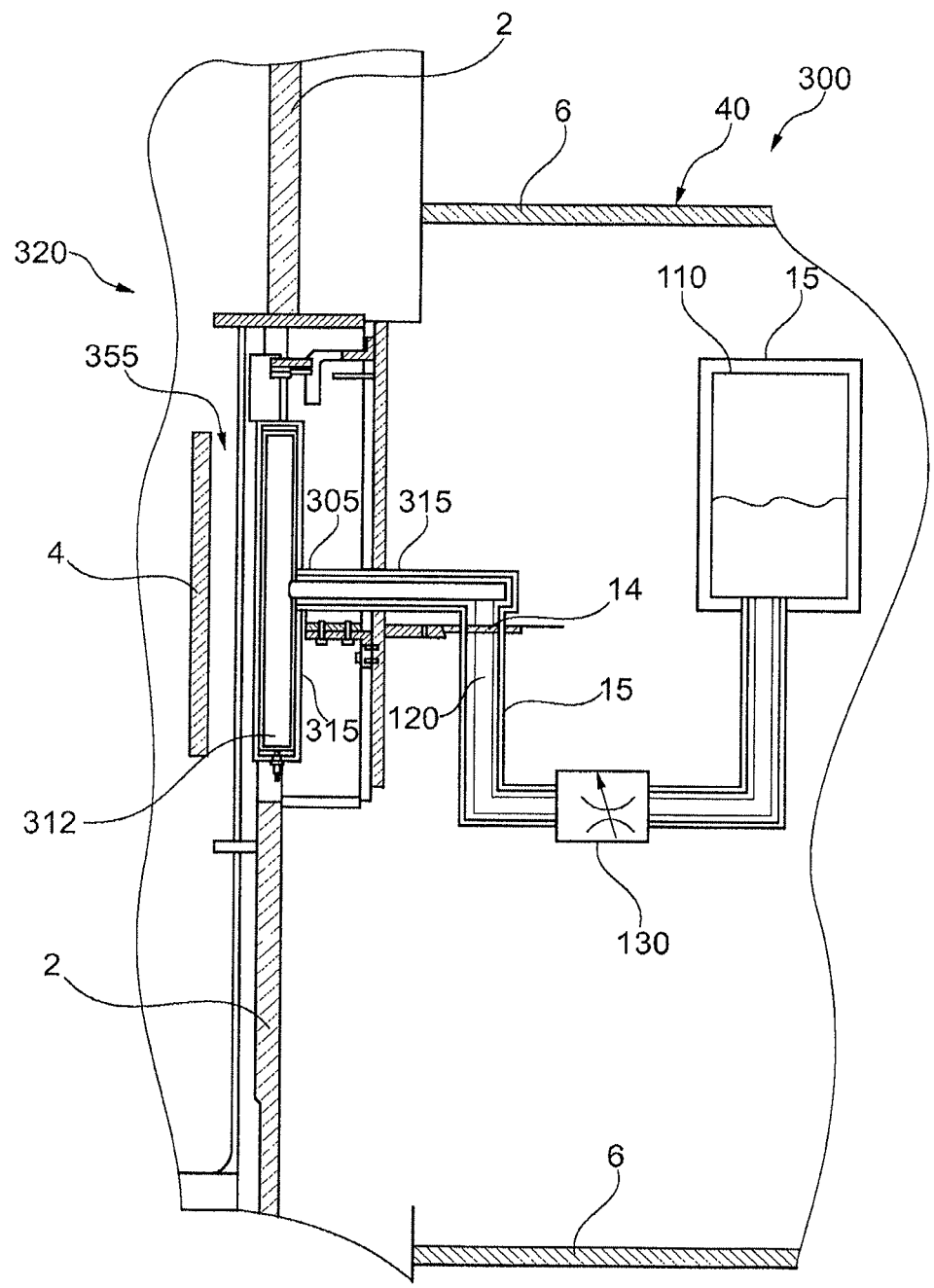
FIG. 3 shows a schematic view of yet another deposition arrangement and an apparatus for evaporation of alkaline metals or alkaline earth metals, such as lithium, according to yet further embodiments described herein and includes a liquefying zone, a control valve for control of a flow rate and an evaporation zone downstream of the valve.

Turning now to FIG. 3, a more detailed schematic view of a processing chamber according to an embodiment of the inventions is depicted. FIG. 3 shows a vapor feed system 300 for a processing chamber 320, such as a vacuum chamber. Only the chamber wall 2 of the processing chamber 320 is shown in this figure. The vapor feed system 300 comprises a vertically oriented linear gas distribution showerhead 312, opposite of which a substrate 4 is disposed. The linear gas distribution showerhead 312 is provided with several gas passageways and is connected with gas conduit or inlet tube 305, which can e.g. be directed at right angles to the linear gas distribution showerhead 312. This linear gas distribution showerhead 312, consequently, serves as a vapor distributor to flow process vapor into a processing region 355.

A material feed system including a tank 110, a control valve 130 and conduits 120 is provided. Optionally, another valve (a shut-off valve, not shown in FIG. 3) for closing and opening the material flow from the tank 110, i.e. a first chamber, to the control valve can be included upstream of the valve. Typically, in order to avoid corrosion of the components in the system, it is beneficial to provide these components further away from the evaporation zone with higher temperatures. Providing components such as a control valve or a shut-off valve in regions where the material to be evaporated has lower temperatures, e.g. only slightly above the melting point, reduces corrosion of these components.

FIG. 3 also illustrates a wall 6 of the enclosure adjacent to the vacuum chamber for deposition. The enclosure can, for example, be a glove box 40, which encompasses the chamber or tank 110, the valve 130 and the conduits 120. The tank 110 can be replaced, exchanged or filled with new lithium under protective gas or under another protective atmosphere. As a protective gas, for example, argon can be used. The conduits 120 and the first chamber, e.g. tank 110, can be heated by heating jacket 15. Yet, the enclosure for those elements can typically be heated entirely as described in more detail with respect to FIG. 6. As shown in FIG. 3, embodiments described herein typically further include a heat separation 14 such as an insulation between the enclosure in which the liquid material is guided and the evaporation zone, e.g. inlet tube 305 in FIG. 3.

In order to enable deposition of lithium the components of the material feed system and the deposition system are configured for lithium usage. Such materials can be selected from the group consisting of: stainless steel, particularly with a carbon content of 0.12% weight-% or smaller, molybdenum, tantalum, columbium, and combinations thereof. For example, the valve can be provided having a valve body made of molybdenum or stainless steel with a carbon content of 0.112 weight-% or below in order to reduce corrosion with lithium or another alkali metal.

According to typical embodiments, the materials to be used for the chambers, i.e. tank 110 and/or the showerhead 312 and the inlet tube 305, the valve 130 and the conduits 120 are configured to be exposed to the reactive material. Typically, the entire vapor feed system is comprised of a material that is inert relative to these reactive materials, such as lithium.

FIG. 3 further shows another heating jacket 315, which provides heating for the evaporation zone. As shown in FIG. 3 the linear vapor distribution showerhead and the inlet tube 305 are heated by the heating jacket 315. Alternatively, other heating means as described herein can additionally or alternatively be provided. The liquid material, which flows through valve 130 and conduit 120, is guided into the inlet tube 305, which is configured for temperatures of e.g. 800° C. or above. During operation the inlet tube and components downstream of the inlet tube are heated to temperatures of e.g. 800° C. or above. In the inlet tube, which forms a further chamber or zone for evaporation, the material entering the inlet tube 305 is evaporated instantaneously and the vapor is guided to the showerhead where it is guided through openings or nozzles to the substrate 4 for deposition of the vapor on the substrate.

Providing for example a linear vapor distribution showerhead for lithium (or other alkali metals) in combination with a liquid flow control enables uniform large area coating. The control of the flow can be provided by a control valve, which is controlled in dependence of a deposition rate monitor and/or a liquid flow meter. Thereby, a linear vapor distribution showerhead can beneficially be utilized for inline deposition tools, where one or more substrates or one or more caffiers with substrates disposed therein are transported past the showerhead.

Figure 4:
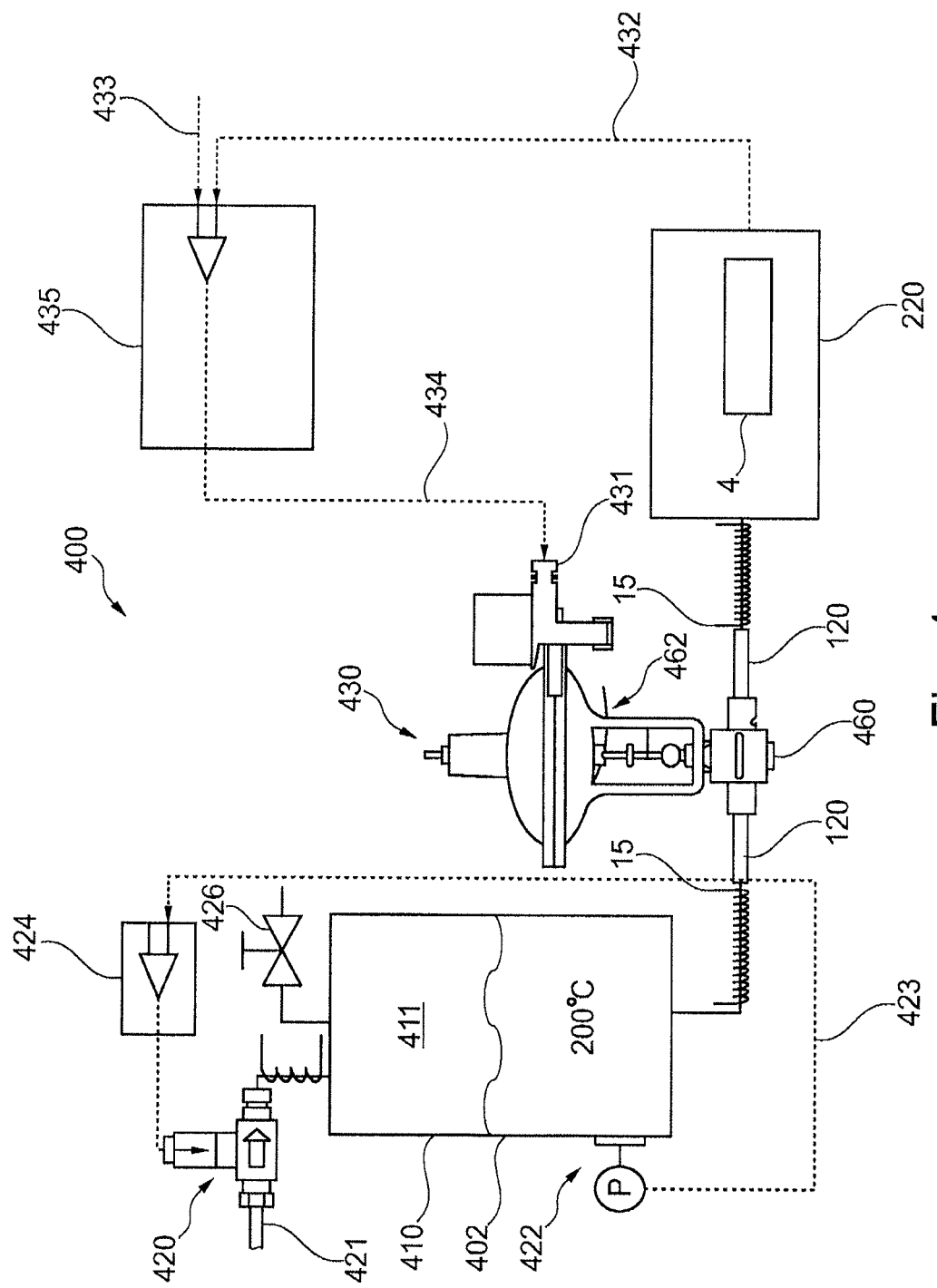
FIG. 4 shows a schematic view of a control scheme of a deposition arrangement for evaporation of alkali metals or alkaline earth metals, such as lithium, according to embodiments described herein and including a liquefying zone, a control valve for control of a flow rate and an evaporation zone downstream of the valve.

FIG. 4 illustrates yet further aspects of a deposition affangement for evaporation of alkali metals or alkaline earth metals, and corresponding controls. The aspects described with respect to FIG. 4 can be combined individually or in combination with other embodiments described herein. A first chamber 410 provides for example liquid lithium 402. Typically, a temperature of about 200° C. can be provided. Thereby, metallic lithium, which is to be deposited in chamber 220 on substrate 4, is liquid and can flow towards the chamber 220 in liquid form. Lithium compounds, such as non-metallic lithium compounds (e.g. lithium oxide), which may be generated due to the high reactivity of lithium, are not melted at such a temperature and will, thus, not flow towards the chamber 220. Accordingly, such lithium compounds can be excluded from the process.

The first chamber for melting the lithium is under a pressure and ambient controlled atmosphere 411. A protective gas, e.g. argon, is provided via conduit 421 in the chamber 410. Valve 420 controls the argon environment at an over pressure of e.g. 100 to 300 mbar, such as 200 mbar. The manual valve 426 can be utilized for purging the tank with argon during maintenance or during refilling of the chamber 410. The pressure in the chamber is monitored by pressure gauge 422. Additionally or alternatively, a pressure gauge can also be provided towards the top of chamber 410 such that the pressure of the zone 411 can additionally or alternatively be measured. Yet further, according to some embodiments, a liquid level sensor can be provided for the chamber 410 such that the liquid Li level in the chamber 410 can additionally be measured. The detected signal is provided by signal line 423 to control 424. Control 424 controls the valve 420 for adjusting the argon flow in the chamber 410. Thereby, a controlled protective environment can be provided for the chamber 410. The chamber 410 is heated as described above and with heating elements according to embodiments described herein. Further, insulation (not shown in FIG. 4) for improved heat control can be provided.

The liquid metallic lithium flows via conduit 120 towards valve 430. Thereby, as indicated by reference numeral 15, a heating jacket 15 can be provided for the conduit in order to avoid clogging of the conduit by solidifying of the lithium. The valve 430 has a valve housing 460. The liquid lithium flows through the valve housing. The amount of liquid lithium is controlled by actuator 462. The actuator 462 can be electrical. Other actuators like pneumatic or hydraulic might also be used. Yet, electrical actuation might be beneficial under conditions of elevated temperatures and controlled atmospheres within a deposition apparatus. Connector 431 provides an input of a signal line 434 from the controller 435. The controller 435 provides a control signal for the flow rate of the liquid lithium through valve 430. The controller can be any controller that allows control of the deposition rate of the lithium on the substrate 4 within the chamber 220. As one example, a feedback control, which can for example utilize a PID controller, can be used. This is shown in FIG. 4 by signal line 432, which provides a signal correlating to the deposition rate in chamber 220 to the controller 435 and the signal line 433, which provides a nominal value as a comparison for the PID controller. According to additional or alternative modifications, also the signal of a mass flow controller or another signal correlating to the deposition rate can be used as a control signal for the controller 435.

Accordingly, the valve 430 controls the flow rate through the valve housing 460 and the conduits 120. Downstream of valve 430 there is a further conduit 120 for fluid connection of the deposition chamber 220 with the valve 430 and in turn the first chamber 410. In the chamber 220, the liquid metallic lithium is flash evaporated before being deposited on the substrate. Thereby, an evaporation zone or evaporation chamber is provided in the chamber 220, which can be at a temperature of 600° C. or above, or even 800° C. or above. According to typical modifications thereof, an evaporation zone or evaporation chamber can also be provided between the valve and the chamber 220. Yet, it should be considered that evaporation close to a showerhead or even within a showerhead reduces the elements to be maintained at vapor temperatures (e.g. >600° C.) during operation.

Figure 5:
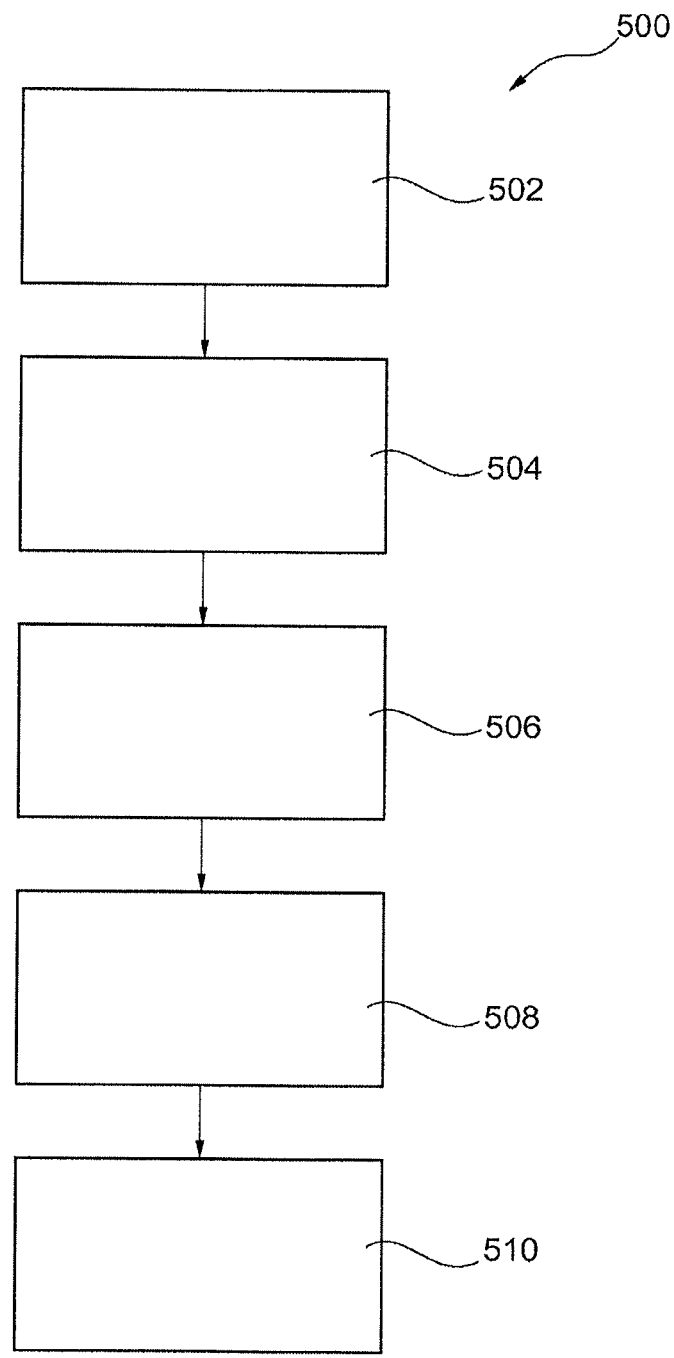
FIG. 5 shows a flow chart of an evaporation method according to embodiments described herein wherein the material is liquefied, a flow rate is controlled by a valve and downstream of the valve the material is evaporated.

FIG. 5 shows a flow chart 500 illustrating embodiments of methods of evaporating a material comprising an alkali metal or alkaline earth metal, particularly metallic lithium. The method includes liquefying the material in a first chamber as indicated by reference numeral 502. In step 504, the liquefied material is guided from the first chamber through a control valve to a second chamber. In step 506, the material is evaporated in the second chamber and the vapor of the material is directed onto a substrate in step 508.

According to typical embodiments, the evaporation step 506 can be provided by flash evaporation particularly at temperatures of 600° C. or above. For example, the temperature can be 800° C. or above. Yet, before step 506, i.e. in step 502 and 504, the liquefied material is maintained at a temperature of 5° C. to 30° C., to 60° C. or 100° C. above the melting point of the material to be deposited, e.g. I 90° C. to 290° C. for metallic lithium. Accordingly, components of the deposition arrangement and deposition apparatus, which are provided upstream of the second chamber for evaporation of the material can have a limited resistance to high temperatures. That is, these components need to withstand only temperatures at which the lithium or another material, according to embodiments described herein, is liquid. This can be particularly beneficial as these materials are also highly reactive.

According to yet further embodiments, which can be combined with other embodiments described herein, a closed loop control, for control of the valve for adjusting the flow rate of the liquefied material through the valve, can be provided, as further illustrated in step 510. The closed loop control of the valve can be simplified as compared to common lithium evaporators as merely a flow rate of liquid material through the valve needs to be controlled. The signal for feedback control can thereby be selected from the group consisting of: a deposition rate monitor in a vacuum chamber for vapor deposition, a flow meter such as a mass flow controller, in the system for guiding the liquefied material to the second chamber, a layer thickness measurement, such as an Eddy current measurement, a vapor pressure measurement in the showerhead, and combinations thereof.

According to embodiments described herein, the control of deposition rate is simplified and more stable. Due to the control of the flow rate of liquid material through the valve, there is no more need to control the deposition by a chamber temperature in the chamber wherein the material is melted and evaporated. Such a chamber temperature control is difficult because although the temperature may be stable, the evaporation rate may be different over the life of the reservoir content. This is because the evaporation rate also depends on the "surface area" of the metallic Li, which is in contact with the heated chamber, which may change over the life of the reservoir as volume ratio (and thus the surface area ratio) of the metallic Li vs. non-metallic Li compounds (reacted or oxidized, higher melting phases of Li) will likely change. Embodiments described herein control the deposition rate with the amount of liquid Li flowing through the valve (e.g., mass flow controllers), which will fully evaporate in the "flash evaporation chamber", i.e. the vapor distribution showerhead or another chamber between the valve and the vapor distribution showerhead. A full evaporation of the Li can be assured as only the metallic Li melts in the first chamber (by keeping the temperature above Li melting temperature but below melting temperature of reacted Li compounds) to flow into the second flash evaporation chamber.

It has to be considered that, according to embodiments described herein, the second chamber, zone or area, in which the liquid material is evaporated, can be provided by various components. The second chamber, zone or area is provided downstream of the valve for control of the flow of liquid material, i.e. the valve is between the second chamber, zone or area and the chamber for liquefying the material. For example, the second chamber, zone or area can be provided by a separate chamber, can be provided by the evaporation nozzle or vapor distribution showerhead, can be provided by surface in or adjacent to the vapor distribution showerhead with a sufficient surface contact area, e.g. in the range of 1 $cm^2$ to 50 $cm^2$, for example 1 $cm^2$ to 10 $cm^2$, to provide sufficient energy to evaporate the material, or can be provided by an inlet tube of the vapor distribution showerhead.

For example, the inlet tube can be integrally formed with the vapor distribution showerhead. Accordingly, the second chamber, zone or area can be provided such that there is an increase in temperature, typically a sudden increase in temperature for flash evaporation, on the pathway from the control valve (see, e.g. valves 130 and 430) to the vapor distribution nozzle or showerhead. Typically, all liquid material is evaporated and the control of the flow rate of the liquid material also controls the deposition rate.

In light of the above, the hardware requirement for embodiments described herein will also be reduced, specifically for the valve (see, e.g. valves 130 and 430) that separates the source for the material and the second chamber, zone or area for evaporation. For common single chamber systems, where lithium is melted and evaporated in a chamber upstream of a valve, the valve must withstand temperatures in the 600° C. to 800° C. range to keep the evaporated Li metal vapor from condensing and clogging up the path. According to embodiments described herein, the valve, and/or mass flow controller, as well as conduits providing a fluid communication between the material source and the second chamber, zone or area need to withstand likely at most 350° C.

Figure 6:
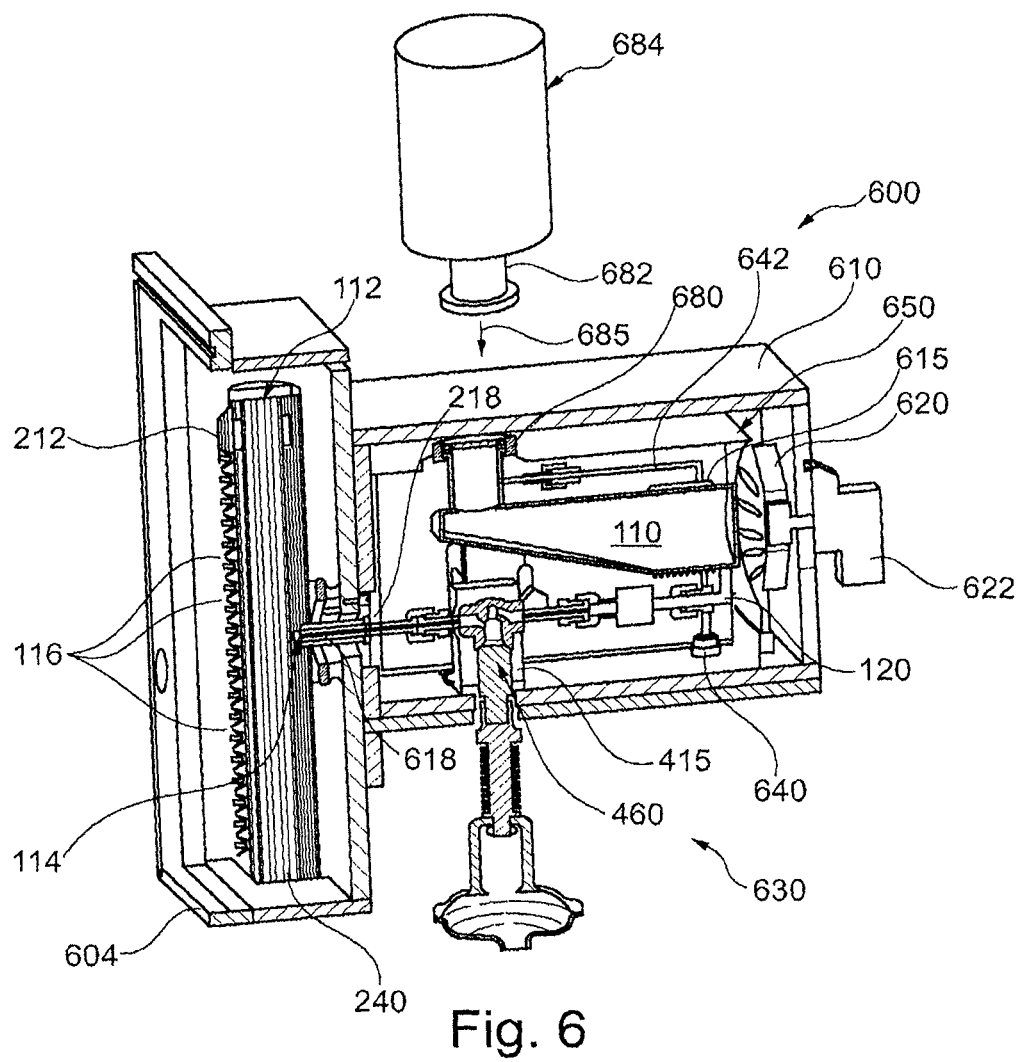
FIG. 6 shows a schematic view of yet another deposition arrangement and an apparatus for evaporation of alkali metals or alkaline earth metals, such as lithium, according to yet further embodiments described herein.

FIG. 6 shows a schematic cross-sectional view of portions of a deposition apparatus with a deposition arrangement 600. Thereby, FIG. 6 illustrates one embodiment and can be used to describe yet further embodiments. The first chamber or tank 110, into which the material to be evaporated, e.g. lithium, is provided in an enclosure 650. For example, the enclosure can be insulated. Thereby, a temperature controlled environment can be provided for the first chamber and the valve body 460 as well as the conduits 120. According to typical embodiments, the temperature can be controlled to be from 185° C. to 250° C., e.g. about 200° C. For alkali metals or alkaline earth metals other than lithium, other temperatures could be provided and adjusted according to the melting point, e.g. to 63° C. or above for potassium. According to typical embodiments, which can be combined with other embodiments described herein, the temperature for liquefying the materials can be provided from 5° C. to 100° C. above the melting point of the material to be deposited on the substrate.

As shown in FIG. 6, the first chamber 110 has a flange 680, which can be exposed by opening the housing 610. The flange 680 can be connected to a flange 682 of a container 684 for refilling of material to be provided in the deposition arrangement 600. Connecting the container 684 with the first chamber or tank 110 is indicated by arrow 685. According to typical embodiments, the procedure of refilling can be provided under a protective atmosphere, e.g. an argon atmosphere. Therefore, a connection of a glove box or other suitable ways to separate the area for refilling from normal atmosphere can be used.

According to typical embodiments, which can be combined with other embodiments described herein, the first chamber can be provided entirely or partly with a heating system 615 to melt the material in the heated portion of the first chamber. The first chamber 110 is in fluid communication with the control valve 460. The fluid communication is provided by conduit 120. Downstream of the valve, the vapor distribution showerhead 112 is provided in fluid communication with the valve 460. According to yet further embodiments, heating of the first chamber, can also be provided, as described above, by the heating of the enclosure 650.

Upon heating of the enclosure 650, the tank 110, the conduits 120 and the valve 130 are heated to the melting point of the respective alkali metal, the metal is melted or liquefied and flows through the conduits in a liquid form. According to typical embodiments, additionally, gas circulation unit such as fan 620 is provided, which can be controlled by controller 622. For example, the controller 622 can be provided outside of the housing 610. The fan 620 allows for gas circulation inside the enclosure 650. Thereby, a uniform atmosphere can be provided inside the enclosure 650.

According to typical embodiments, which can be combined with other embodiments described herein, the enclosure 650 is at atmospheric pressure and at a temperature slightly above the melting point of the material to be evaporated, e.g. 200° C. According to one implementation, the gas in the enclosure 650 can be air, as the reactive material is inside the material feed and regulation system, which is under a protective atmosphere as described above. According to y yet further implementation, a protective gas, such as argon, can also be provided in the enclosure 650 to even better avoid contact of reactive gases with the material to be melted.

According to yet further embodiments, which can be combined with other embodiments described herein, the material feed system provided by the first chamber, the one or more conduits and the valve, can further include a purge valve 640 and a purge conduit 642. The purge conduit 642 and, thus, the purge valve 640 is connected with e.g. the portion of the flange 680 facing the first chamber 110. The conduit can additionally or alternatively be provided at the first chamber or at the conduit. For example, the conduit from the tank to the valve can be connected to a purge conduit. The purge conduit can, according to yet further modifications, also be provided as a purge conduit arrangement with a plurality of purge conduits connected to the material feed system. However, typically, the purge conduit is provided at least at an upstream end of the material feed system. According to methods of operating the deposition arrangement, the purge valve can be connected with a source of hot argon. Thereby, for example in the gas of clogging of a portion of the material feed system, the material feed system can be flushed with hot argon. For example, the argon can be heated by guided argon tubes around the tank with liquid lithium. Further, during setting-up of operation, the material feed system can be purged with argon to avoid having oxygen and/or moisture in the system before lithium or another alkali-metal is provided in the material feed system.

As shown in FIG. 6, valve 130 is connected to tank 110 via conduit 120 and with the vapor distribution showerhead by further conduit 120. As shown in FIG. 6 and according to some embodiments described herein, a vacuum feed-through 218 is provided for the conduit to feed the metal, e.g. the liquid metal, into the chamber portion housing the showerhead 112. According to typical implementations, which can be optionally be provided. The conduit portion downstream of the feed-through from the enclosure 650 to the chamber portion housing the showerhead is heated by heating unit 618. Thereby, the portions of the deposition arrangement downstream of the enclosure 650 can be heated to higher temperatures as compared to the portions of the deposition arrangement disposed in the enclosure 650.

The chamber portion housing the showerhead can be connected to a vacuum chamber via flange 604. As also shown in FIG. 6, adjacent or in the vapor distribution showerhead 112 an evaporation surface is heated to vaporize the liquid lithium as indicated by evaporation zone 114. The material evaporated in the evaporation zone 114 is guided into and/or distributed in the vapor distribution showerhead 112.

According to typical implementations, which can be combined with other embodiments described herein, the evaporation zone 114 can be a chamber, crucible, boat, or surface, configured to provide the energy for evaporation. Typically, the zone or surface has a sufficient surface contact area, e.g. in the range of 1 cm$^2$ to 10 cm$^2$, to provide sufficient energy to evaporate the material. Thereby, the liquid material is continuously fed into the zone or on the surface and is evaporated when it hits the surface. The heating unit 618, which is mentioned above, can be configured to continuously increase the temperature of the liquid material towards the evaporation zone 114.

The vapor distribution showerhead is heated by a heating unit, e.g. an inner heating tube 240, wherein further details, aspects, features and additional or alternative implementation of a heating unit are described in other embodiments described herein. Typically, the showerhead is provided with an insulator 212 for thermal insulation of the vapor distribution showerhead 112. The outlets, e.g. nozzles 116, provided at the vapor distribution showerhead guide or direct the vapor of e.g. lithium towards a substrate. According to typical embodiments, the outlets or nozzles can be provided as described with respect to other embodiments referred to herein.

Further, according to embodiments described herein, the valve 460 is configured and/or arranged such that liquid alkali metal, .e.g. liquid metallic lithium, flows through the valve. In order to improve control of the control valve 460 and to compensated for heat loss to the actuator of the valve, which can for example be outside at room temperature, the control valve 460 can be provided with a separate heating element 415 and optionally also with a separate thermal insulator and control circuit of the temperature of the valve. Thereby, temperature variations of the temperature of the control valve can be reduced. Accordingly, flow rate control of the liquid material can be improved.

Figure 7:
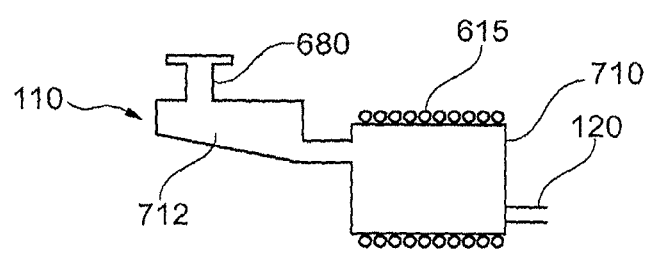
FIG. 7 shows a schematic view of a first chamber to be used in some embodiments of deposition arrangements according to embodiments described herein.

FIG. 7 shows an alternative solution of a first chamber 110, which can be implemented in any of the deposition arrangements described herein. The first chamber or tank 110 includes a first chamber portion 712. The first chamber portion 712 can be filled with solid material through flange 680. The first chamber portion 712 is connected to a second chamber portion 710. The material is melted in the second chamber portion 710. Therefore, for example heating elements 615 can be provided. For example, electrical heaters can be used. Additionally, or alternatively radiation heaters could be used. The material melted ion the second chamber portion 120 flows in liquid form in conduit 120, i.e. through the material feed system as described herein. According to yet further embodiments, the first chamber portion 712 can be provided with an actuator for transporting material towards and into the second chamber 710. For example, a feed screw can be provided in the first chamber portion. According to yet further implementations, the first chamber portion and the second chamber portion can also be provided by two adjacent spaces within the same chamber. By providing a first chamber portion or a first chamber and a second chamber portion or a second chamber, feeding of new material can be better controlled such that the temperature of the melting zone does not drop suddenly on insertion of solid material. Particularly, the temperature in the second chamber portion can be controlled to be more stable.

According to another option, the material can also be melted in the first chamber portion 712 and optionally a valve can be provided between the first chamber portion and the second chamber portion. Accordingly, by providing a first chamber portion or a first chamber and a second chamber portion or a second chamber, feeding of new material can be better controlled such that the temperature of the melting zone does not drop suddenly on insertion of solid material. Particularly, the temperature in the second chamber portion can be controlled to be more stable.

While the foregoing is directed to embodiments of the invention, other and further embodiments of the invention may be devised without departing from the basic scope thereof, and the scope thereof is determined by the claims that follow.

What is claimed is:

1. A depositing arrangement for evaporation of a material comprising an alkali metal or alkaline earth metal and for deposition of the material on a substrate disposed in a physical vapor deposition chamber, comprising:
   a first chamber configured to liquefy the material, the first chamber having a non-reactive atmosphere, the non-reactive atmosphere preventing a reaction with the material;
   a valve being in fluid communication with the first chamber, and being downstream of the first chamber, wherein the valve is configured to control of the flow rate of the liquefied material through the valve and wherein the valve is configured to further provide the liquefied material;
   an evaporation zone being in fluid communication with the valve, and being downstream of the valve, wherein the evaporation zone comprises a surface disposed within a plenum defined by inner walls of a vapor distribution showerhead, the surface being heated by a first heating unit disposed in the plenum and configured to provide thermal energy to the material at a temperature suitable for evaporating the material;
   a second heating unit to heat the material to higher temperatures before providing the material in the evaporation zone; and
   the vapor distribution showerhead comprising one or more outlets to direct the vaporized material towards the substrate.

2. The arrangement according to claim 1, wherein the vapor distribution showerhead is a linear vapor distribution showerhead.

3. The arrangement according to claim 1, further comprising:
   a controller connected to the valve, wherein the controller is configured to control the valve for adjusting the deposition rate of the vapor on the substrate.

4. The arrangement according to claim 3, wherein the controller is a proportional-integral-derivative controller, and wherein the controller comprises:
   a signal input configured to receive a signal of a deposition rate monitor system.

5. The arrangement according to claim 1, wherein the first chamber comprises:
   a gas inlet configured for inlet of a protective gas in the first chamber, the arrangement further comprising a further valve configured to control the flow rate of the protective gas in the first chamber.

6. The arrangement according to claim 5, wherein the first chamber further comprises a pressure gauge in communication with the further valve.

7. The arrangement according to claim 1, wherein the material is metallic lithium.

8. The arrangement according to claim 1, further comprising:
an enclosure for housing at least the first chamber and the valve, wherein the enclosure is configured for exchange of the first chamber under protective atmosphere.

9. A deposition apparatus for evaporation of a material comprising an alkali metal or alkaline earth metal and for deposition of the material on a substrate, the apparatus comprising:
a vacuum chamber for depositing the material on the substrate; and
a depositing arrangement for evaporation of a material comprising an alkali metal or alkaline earth metal and for deposition of the material on a substrate, comprising:
a first chamber configured to liquefy the material, the first chamber having a non-reactive atmosphere, the non-reactive atmosphere preventing a reaction with the material;
a valve being in fluid communication with the first chamber, and being downstream of the first chamber, wherein the valve is configured to control the flow rate of the liquefied material through the valve, and wherein the valve is configured to further provide the liquefied material;
an evaporation zone being in fluid communication with the valve, and being downstream of the valve, wherein the evaporation zone comprises a surface disposed within a plenum defined by inner walls of a vapor distribution showerhead, the surface being heated by a first heating unit disposed in the plenum and configured to provide thermal energy to the material at a temperature suitable for evaporating the material;
a second heating unit to heat the material to higher temperatures before providing the material in the evaporation zone; and
the vapor distribution showerhead comprising one or more outlets to direct the vaporized material towards the substrate.

10. The arrangement according to claim 1, wherein the surface has a surface contact area in the range of 1 $cm^2$ to 10 $cm^2$.

11. The arrangement according to claim 1, a deposition rate measurement device provided in the vacuum chamber, wherein the deposition rate measurement device feeds a controller which controls the valve and a flow rate through the valve.

12. The arrangement according to claim 9, wherein the surface has a surface contact area in the range of 1 $cm^2$ to 10 $cm^2$.

13. The arrangement according to claim 9, a deposition rate measurement device provided in the vacuum chamber, wherein the deposition rate measurement device feeds a controller which controls the valve and a flow rate through the valve.

* * * * *